(12) United States Patent
Cheng et al.

(10) Patent No.: US 7,326,986 B2
(45) Date of Patent: Feb. 5, 2008

(54) TRENCH MEMORY

(75) Inventors: Kangguo Cheng, Beacon, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 11/306,669

(22) Filed: Jan. 6, 2006

(65) Prior Publication Data

US 2007/0158724 A1 Jul. 12, 2007

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/301; 257/304; 257/E27.092; 257/E29.346

(58) Field of Classification Search ................ 257/301, 257/302, 304, E27.092, E29.346
See application file for complete search history.

(56) References Cited

U.S. PATENT DOCUMENTS

| | | | |
|---|---|---|---|
| 5,482,883 A | 1/1996 | Rajeevakumar | |
| 6,163,045 A | 12/2000 | Mandelman et al. | |
| 6,265,279 B1 | 7/2001 | Radens et al. | |
| 6,300,683 B1 | 10/2001 | Nagasaka et al. | |
| 6,373,086 B1 | 4/2002 | Mandelman et al. | |
| 6,399,977 B1 | 6/2002 | Alsmeier | |
| 6,465,370 B1 | 10/2002 | Schrems et al. | |
| 6,818,534 B2 | 11/2004 | Davis et al. | |
| 6,828,191 B1 | 12/2004 | Wurster et al. | |
| 6,917,064 B2 * | 7/2005 | Kito et al. | 257/301 |
| 2005/0093044 A1 | 5/2005 | Cheng et al. | |

* cited by examiner

*Primary Examiner*—Hoai V Pham
(74) *Attorney, Agent, or Firm*—Ohlandt, Greeley, Ruggiero & Perle, L.L.P.

(57) ABSTRACT

A trench device and method for fabricating same are provided. The trench device has a collar with a first portion that is doped and a second portion that is undoped. Fabrication of the partially doped collar can be done by deposition of a doped insulator in the trench, removal of a portion of the doped deposition, deposition of an undoped insulator in the trench and removal of a portion of the doped and undoped insulators.

12 Claims, 8 Drawing Sheets

TRENCH MEMORY

FIELD OF THE INVENTION

This invention relates generally to semiconductors and, more particularly, to trench memory devices and a method for manufacturing same.

DESCRIPTION OF THE RELATED ART

In trench memory, retention of an electric charge in a cell capacitor is greatly influenced by various leakage mechanisms. Trench memory devices or structures are subject to vertical parasitic leakage that degrades charge or data retention. As shown in FIG. 1, a vertical parasitic transistor is formed in a contemporary trench memory structure where the N+ buried strap is the drain, the N+ buried plate is the source, the N+ trench poly is the gate and the collar oxide is the gate dielectric. Vertical parasitic leakage current is generated due to the sub-threshold current of the vertical parasitic transistor, degrading the charge retention.

The resulting vertical parasitic leakage current can be suppressed through increased p-well doping. However, increasing p-well doping leads to other problems, such as elevated junction leakage and depressed write-back current.

In U.S. Pat. No. 6,818,534, it is suggested to utilize a fully doped collar in trench DRAM to improve leakage performance. As shown in FIG. 2, a fully boron-doped collar is utilized. However, the boron in the collar counter-dopes arsenic-doped N+ poly, causing high poly resistance. Additionally, the fully boron-doped collar is left exposed during subsequent high-temperature processes, such as, for example, the STI process. These high-temperature processes cause boron contamination and undesired auto-doping in the active area. The closeness of the heavily doped P-well also disturbs the characteristics of the array transistor.

Accordingly, there is a need for trench memory that reduces or suppresses vertical parasitic leakage. There is a further need for a process of manufacturing such trench memory structures or devices.

SUMMARY OF THE INVENTION

In one aspect, a trench memory cell is provided comprising a trench capacitor and a transistor. The trench capacitor is formed in a silicon substrate and has a collar comprising a doped insulator portion and an undoped insulator portion. The transistor comprises a gate, a source and a drain, wherein the drain is electrically coupled to the trench capacitor. The undoped insulator portion is above the doped insulator portion.

In another aspect, a deep trench capacitor is provided comprising a substrate; a trench in the substrate and having one or more walls; a buried plate of a first conductivity type positioned in the substrate near a lower portion of the trench; a node dielectric layer on the one or more walls of the lower portion of the trench; a well region of a second conductivity type in the substrate above the buried plate; a strap of the first conductivity type adjacent to the trench; a conducting material fill disposed in the trench; and a collar insulator formed upon the one or more walls of the trench above the buried plate. The collar insulator comprises a doped portion and an undoped portion.

In yet another aspect, a method of manufacturing a trench memory device is provided comprising: providing a substrate; forming a trench in the substrate, wherein the trench comprises sidewalls; forming a buried plate in the substrate in proximity to the bottom portion of the trench; layering a node dielectric along the sidewalls of the bottom portion of the trench; forming a first layer of conducting material in a bottom portion of the trench; forming a collar on the sidewalls of the trench above the first layer of conducting material, wherein said collar comprises a doped portion and an undoped portion; forming a second layer of conducting material in the trench above the first layer of conducting material; and forming a shallow isolation region in a top portion of the substrate, wherein the shallow isolation region caps the trench.

The undoped portion of the collar insulator can be positioned above the doped portion of the collar insulator. The capacitor may further comprise a shallow trench isolation adjacent to the trench and on a top portion of the silicon substrate. The first conductivity type can be N-type and the second conductivity type can be P-type. Alternatively, the first conductivity type can be P-type and the second conductivity type can be N-type. The doped portion of the collar insulator can be less than 50% of the undoped portion of the collar insulator.

The manufacturing method may further comprise planarizing a top surface of the substrate after forming the shallow isolation region, wherein the substrate comprises a nitride layer. The method can further comprise forming a buried-strap connected to a top portion of the trench. The method may further comprise: depositing a doped insulator layer along the substrate and into the trench; removing a portion of the doped insulator via etchback; depositing an undoped insulator layer along the substrate and into the trench; and removing a portion of the undoped insulator layer or the doped insulator layer to form the collar. The method can further comprise performing reactive ion etching. The method may further comprise performing high density plasma deposition.

The above-described and other features and advantages of the present disclosure will be appreciated and understood by those skilled in the art from the following detailed description, drawings, and appended claims.

DETAILED DESCRIPTION OF THE INVENTION

Figure 1:
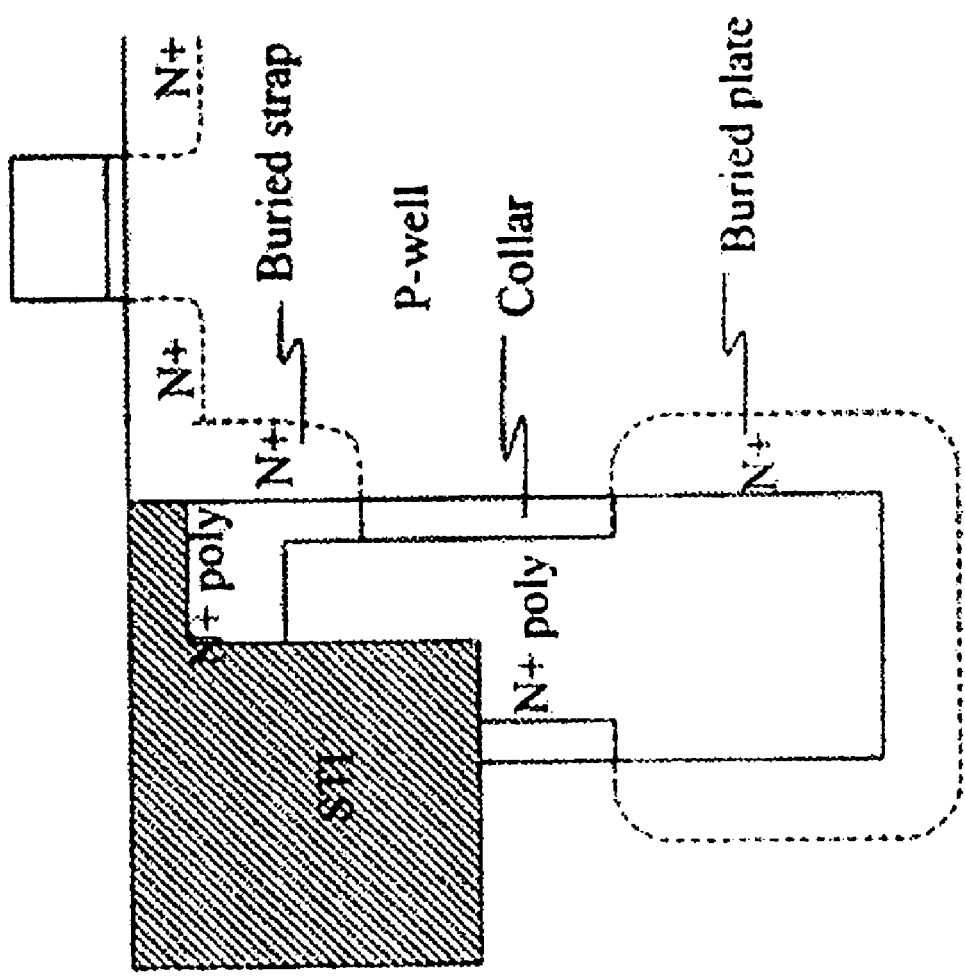
FIG. 1 is a schematic illustration of a prior art trench memory structure.
Figure 2:
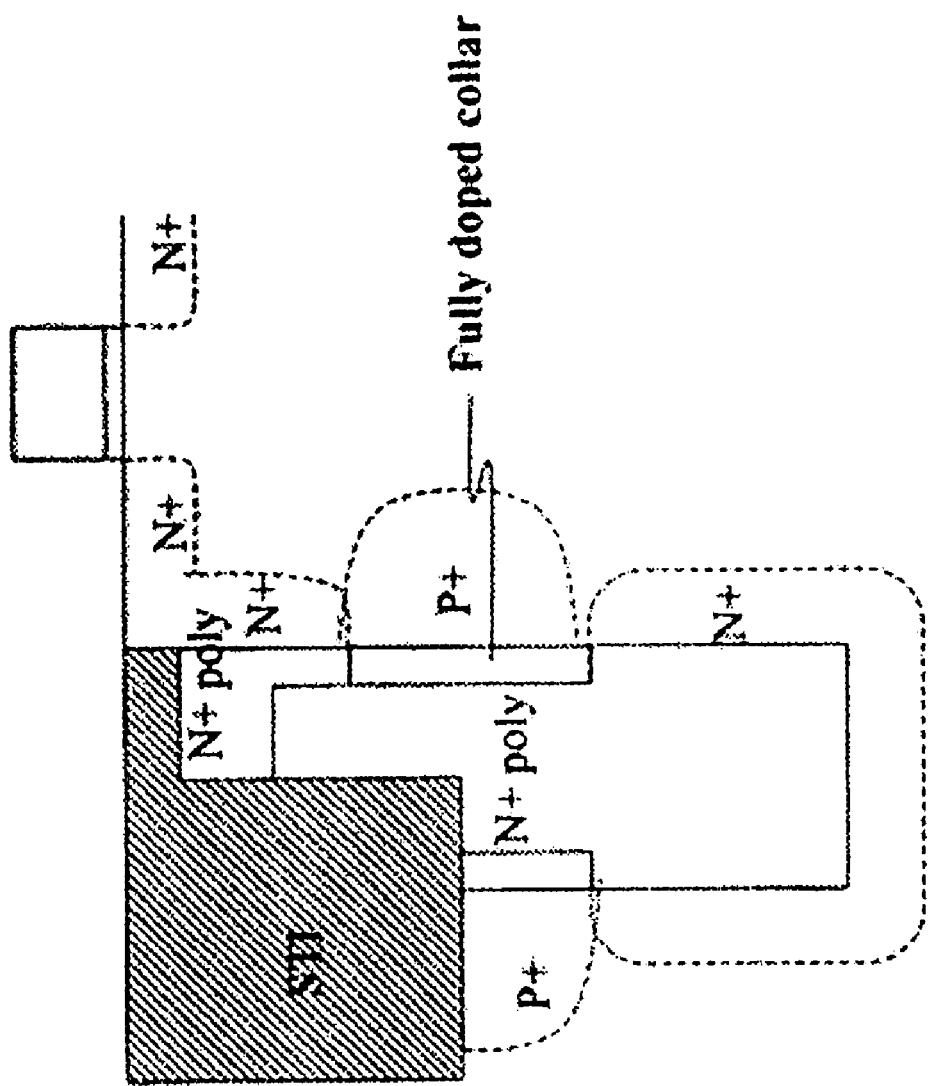
FIG. 2 is a schematic illustration of a prior art trench memory structure as described in U.S. Pat. No. 6,818,534.
Figure 3:
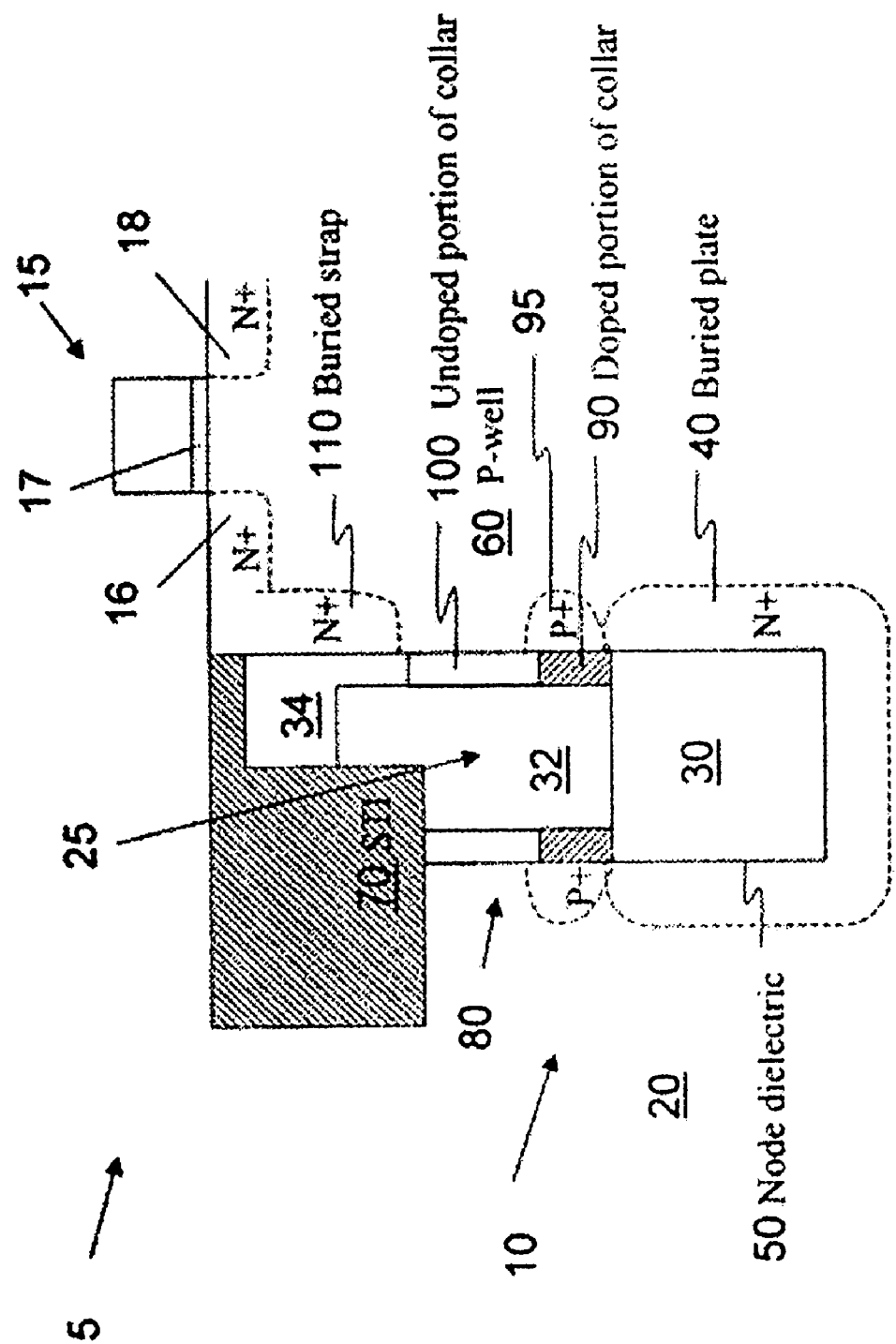
FIG. 3 is a schematic illustration of a trench memory structure according to an exemplary embodiment of the present invention.

Referring now to the drawings and in particular to FIG. 3, an exemplary embodiment of a trench memory structure is shown and generally represented by reference numeral 5. Trench memory structure 5 can be used in various devices and systems such as, for example, embedded DRAM, DRAM, SRAM, system-on-chip and application-specific integrated circuits. Trench memory structure 5 has one or more deep trench storage capacitors 10 and one or more transistors 15, such as, for example, a MOSFET, in or on a substrate 20. Trench memory structure 5 would typically comprise an array of deep trench capacitors 10 coupled with an array of transistors 15 to form an array of memory cells interconnected by rows and columns for reading data from, or writing data to, the memory cells. For simplicity, trench memory structure 5 is being described with respect to one of the deep trench capacitors 10 coupled with one of the transistors 15, but of course any number could be used.

Deep trench capacitor 10 has a trench 25 in substrate 20. The trench 25 is filled with conducting materials such as N+ polycrystalline silicon (poly) 30, 32, and 34. Other conducting materials such as metals, metallic compounds, silicides, and any combination of these materials including polysilicon can also be used to fill the trench. Near a bottom portion of trench 26, a buried plate 40 is positioned. The buried plate is a heavily doped region. For instance, the buried plate can be doped by arsenic or phosphorous. The poly 30 and buried plate 40 are isolated from each other by a node dielectric layer 50 formed along the walls of the bottom portion of the trench 25. A P-well 60 is positioned in the substrate 20 above the buried plate 40. A shallow trench isolation region (STI) 70 is formed into the substrate 20 from a top surface thereof.

Along the walls of trench 25, a collar 80 is formed, which is adjacent to the walls of the P-well 60. The collar 80 comprises a first portion 90 and a second portion 100. The first portion 90 is a doped insulator, such as, for example, boron-doped oxide. The second portion 100 is an undoped insulator such as an oxide. The doped portion 90 is positioned along a lower portion of collar 80, while the undoped portion 100 is positioned along an upper portion of the collar. A buried strap 110 is connected at the top of the trench 25 to the drain 16 of the transistor 15, which also has a gate 17 and a source 18 as illustrated in FIG. 3.

The trench memory structure 5 with the collar 80 comprising both doped and undoped portions 90 and 100 provides several advantages. First, a localized and heavily doped P+ region 95 is formed next to the doped portion of the collar 90 by driving the dopants in the doped collar to the substrate. This heavily doped P+ region 95 increases the threshold voltage of the vertical parasitic transistor and therefore suppresses the vertical parasitic leakage. Second, less counter-doping of the N+ poly 30 occurs due to the use of undoped portion 100 of the collar 80, which reduces poly resistance. Third, the doped portion 90 of the collar 80 is no longer exposed (being sealed by the undoped portion 100) during subsequent high temperature processes, such as, for example, STI formation, so there is no contamination or undesired auto-doping in the active area. Fourth, the transistor 15 is not disturbed as the P+ region is far enough away from the transistor. Finally, the P+ region has minimal impact on substrate sensitivity as it is localized.

Figure 4:
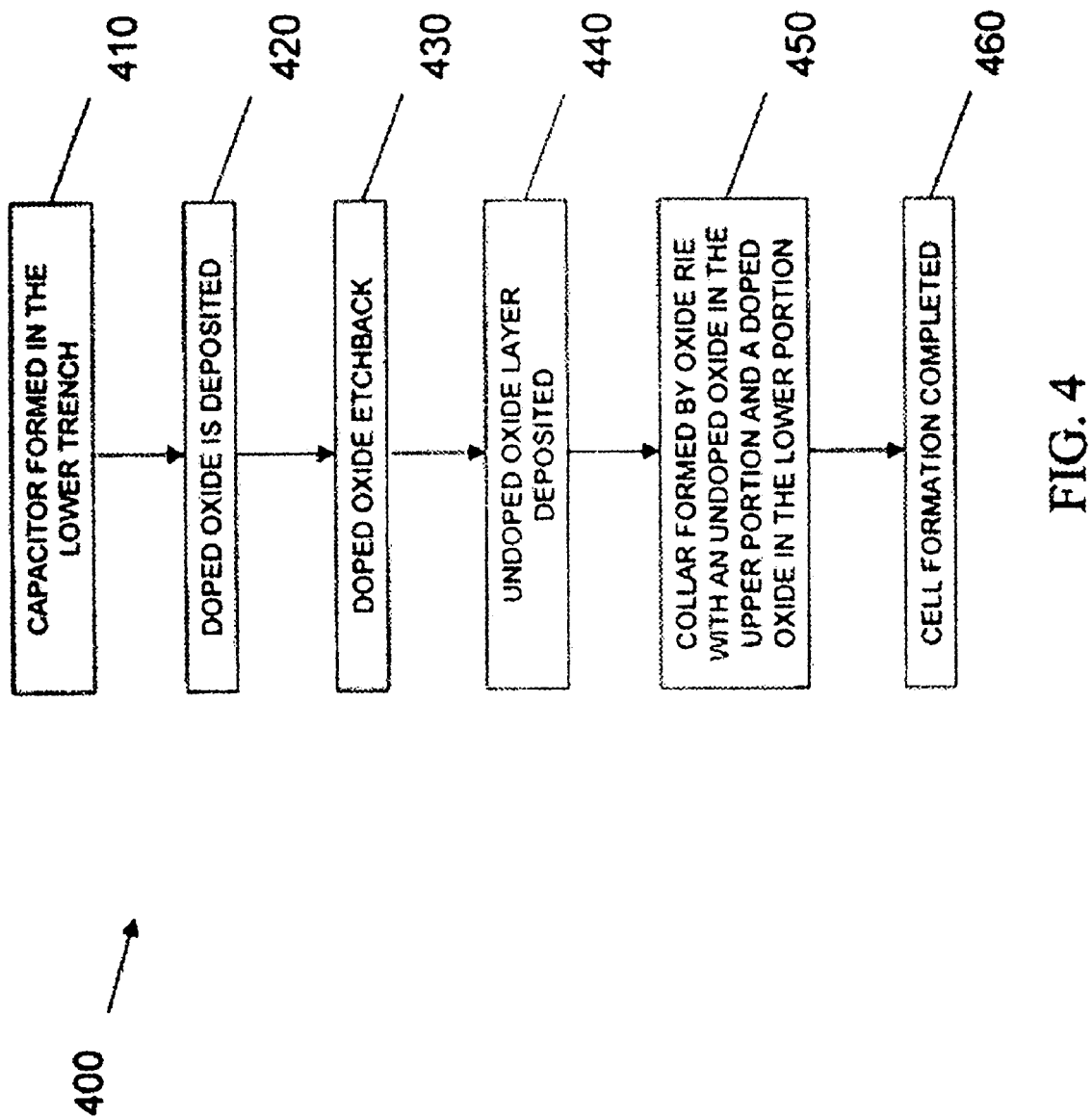
FIG. 4 is a method of manufacturing the trench memory structure of FIG. 3.
Figure 5A:
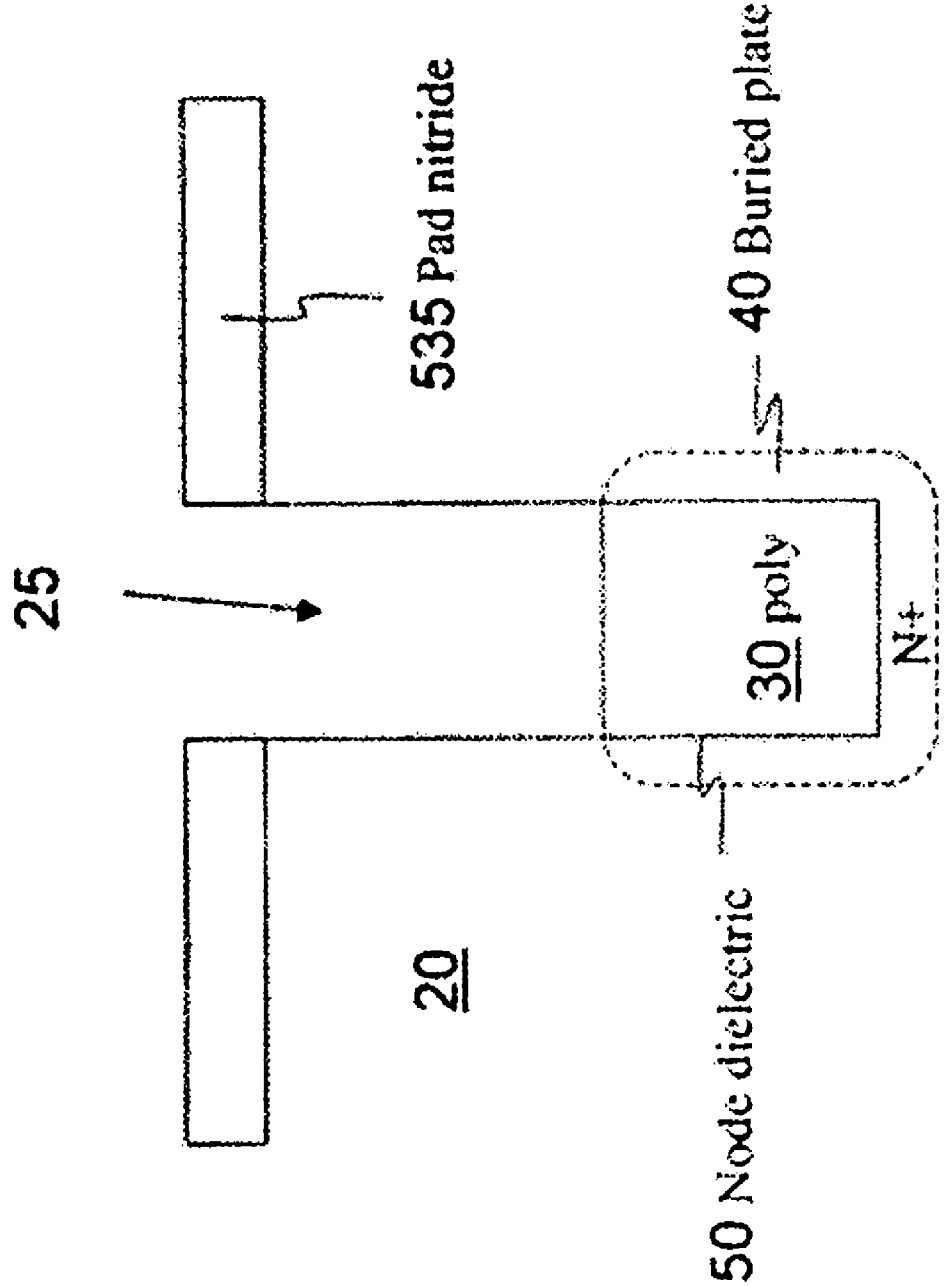
FIG. 5A is a first portion of a trench memory structure during manufacture by the method of FIG. 4.
Figure 5B:
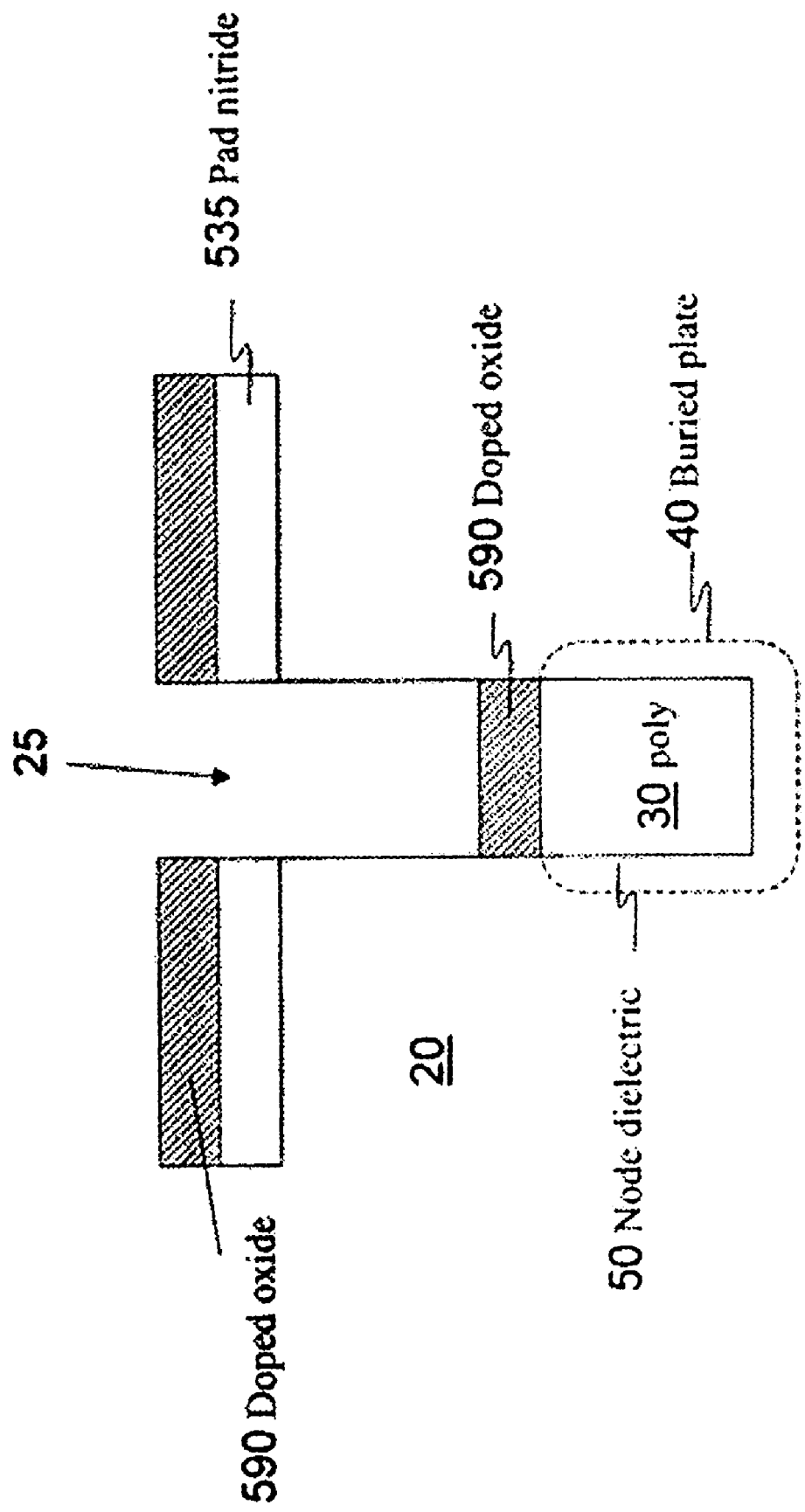
FIG. 5B is a second portion of a trench memory structure during manufacture by the method of FIG. 4.
Figure 5C:
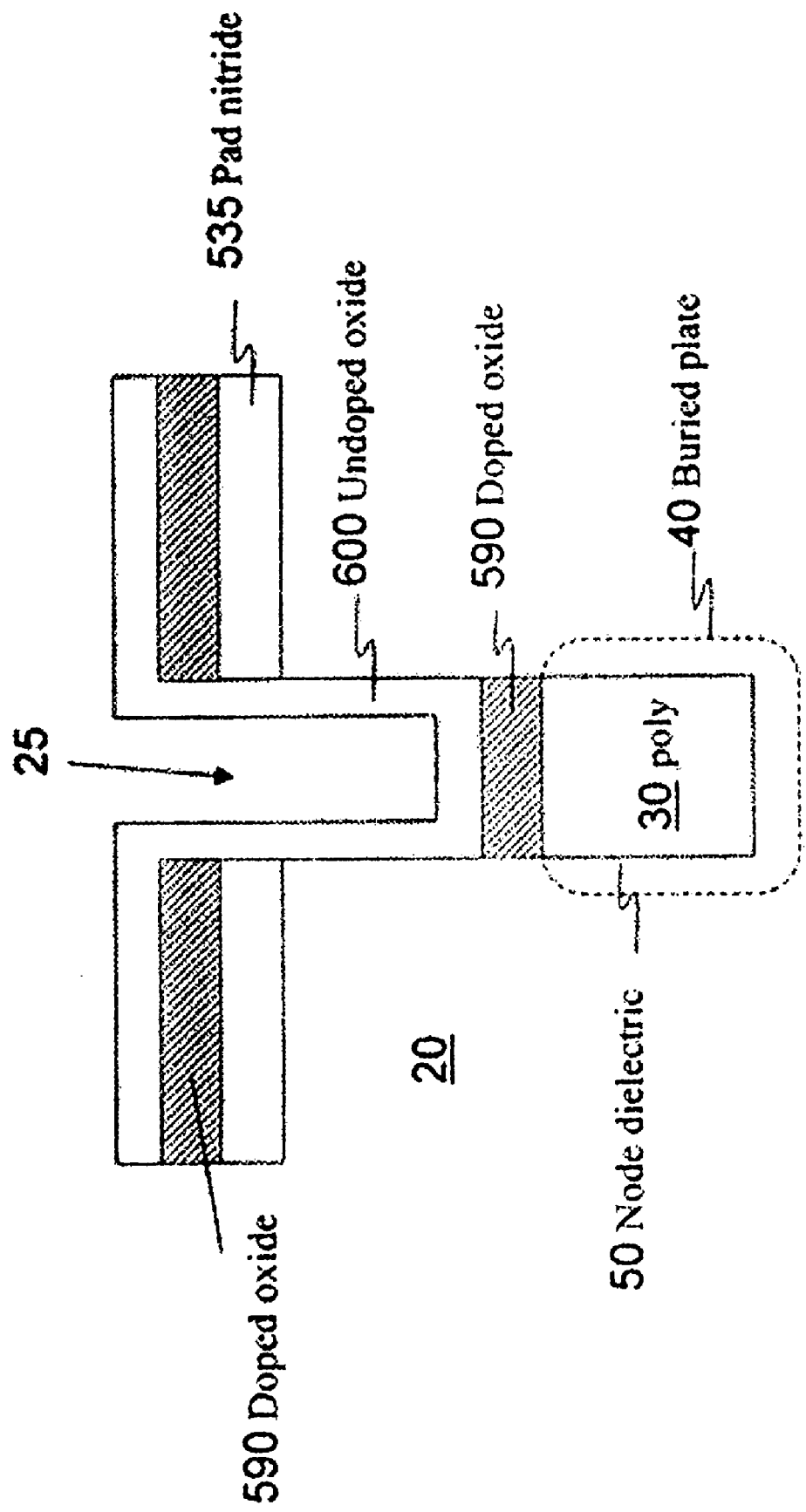
FIG. 5C is a third portion of a trench memory structure during manufacture by the method of FIG. 4.
Figure 5D:
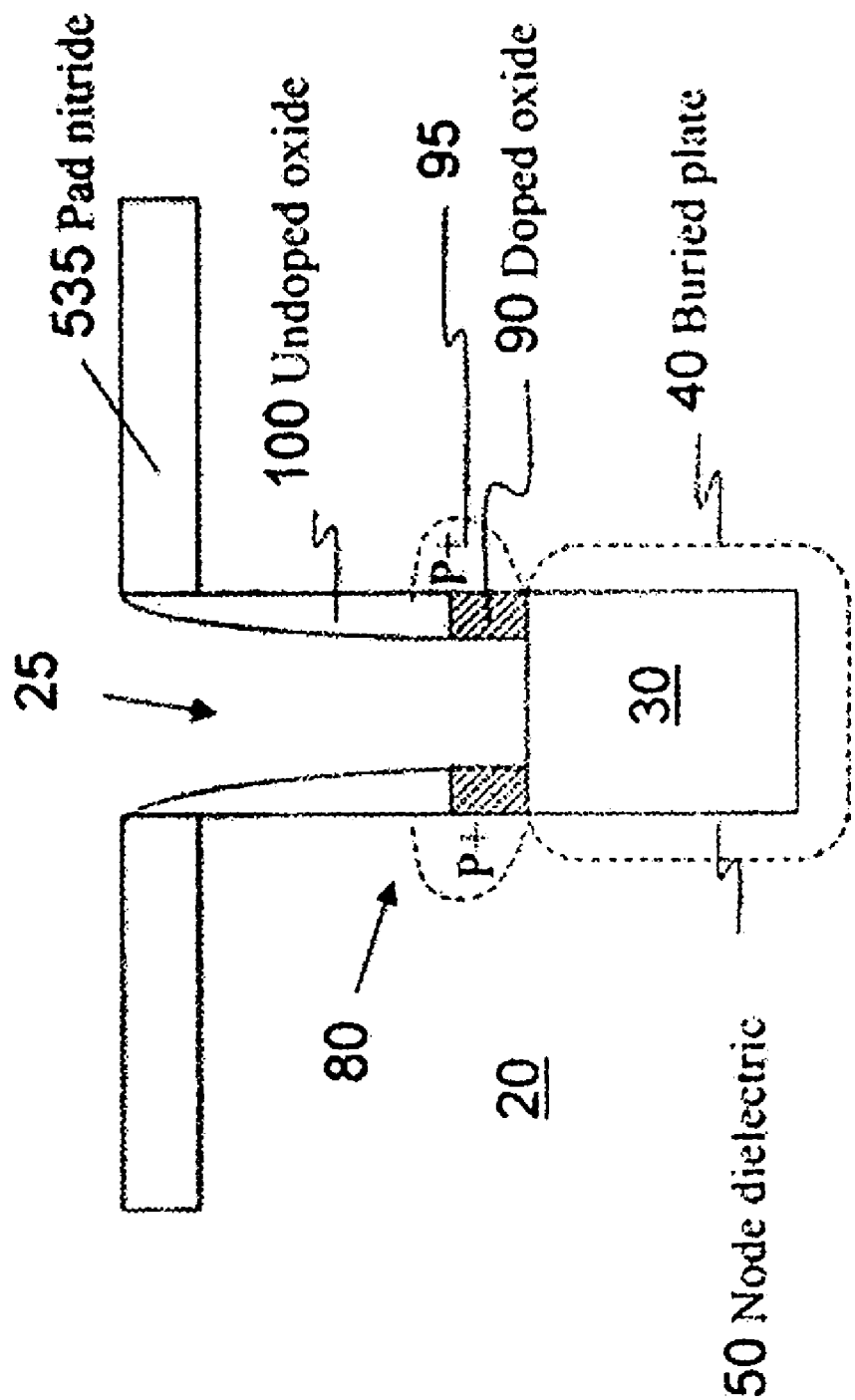
FIG. 5D is a fourth portion of a trench memory structure during manufacture by the method of FIG. 4.

Referring to FIGS. 4 through 5D, a method for manufacturing the trench memory structure 5 is illustrated and generally shown by reference numeral 400. In step 400, standard deep trench processing is used to form the deep trench capacitor 10 into the substrate 20. This may include etching of the trench 25 to a predetermined depth, filling of the poly 30 into the trench and recessing the poly to a depth of about 700-1500 nm, positioning of the buried plate 40 into the substrate and layering of the node dielectric 50 along the wall of the trench. A pad layer 535 is positioned along the top surface of the substrate 20 adjacent the trench 25. The pad layer, which may comprise a nitride layer with an optional underlying oxide layer, protects the substrate 20 in the subsequent process. The resulting first portion of trench memory 5 is shown in FIG. 5A.

In step 420, a doped insulating material 590 is deposited along the substrate 20, into trench 25 and above the poly 30. The doped insulator 590 can be oxide, oxynitride, nitride, other dielectric materials such as "high-k" materials, or any suitable of combination of these materials. Preferably, the insulator 590 is an oxide that is doped with a P-type dopant such as boron or indium with a concentration of 0.1-6% in weight and more preferably 1-2% in weight. The process for depositing the insulator 590, includes but is not limited to, chemical vapor deposition (CVD), atomic layer deposition (ALD), physical vapor deposition (PVD), sputtering, plating, or any suitable combination of these processes. Preferably, the insulator 590 is deposited by a high density plasma (HDP) CVD process. Due to the anisotropic nature of HDP process, i.e, the deposition rate of HDP process is higher in the vertical direction than in the lateral direction), the oxide thickness on top of the poly 30 and pad layer 535 is greater than on trench sidewall.

For example, the oxide thickness on trench sidewall is only one third of the oxide 1 thickness on top of the poly and pad layer by a typical HDP deposition process. Preferably, the oxide thickness ranges from 50-200 nm on top of the poly and pad layer and 15-70 nm on trench sidewall after HDP deposition. Optionally, an oxide liner (not shown) of approximately 2-6 nm may be formed by thermal oxidation before HDP deposition to protect the trench sidewall from the attack of plasma during HDP process. In one embodiment, the insulator 590 is in-situ doped during deposition. In another embodiment, the insulator 590 is doped after deposition. For example, ion implantation of boron after deposition can be used to form a P-type doped insulator 590.

Portions of the doped insulator 590 are then removed from trench sidewall by an etchback in step 430. When the doped insulator is oxide deposited by HDP process, a timed wet etch comprising buffered HF (BHF) or diluted HF (DHF) can be used. Approximately the same amount of HDP oxide is removed from the top of the poly and pad layer, resulting approximate 30-150 nm doped oxide on top of the poly and the pad nitride after etch. The optional oxide liner, if present, may be removed along with the HDP oxide by BHF or DHF. The resulting first portion of trench memory 5 is shown in FIG. 5B.

In step 440, undoped insulator 600 is deposited into the trench 25 and above the doped insulator 590. The undoped insulator 600 can be oxide, oxynitride, nitride, or any other suitable dielectric materials deposited by any suitable deposition techniques, such as chemical vapor deposition (CVD), thermal oxidation, atomic layer deposition (ALD), physical vapor deposition (PVD), sputtering, plating, and any combination of these techniques. The undoped layer may be oxide, oxynitride, nitride, other dielectric materials such as "high-k" materials, or any suitable of combination of these materials. Preferably, the undoped insulator 600 is an oxide deposited by a conformal process such low-pressure CVD process. In another embodiment, the undoped insulator 600 is an oxide formed by thermally oxidizing the exposed trench sidewall. When thermal oxidation is used, the undoped collar is formed only on trench sidewall, deposited by a conformal process such low-pressure CVD process. The thickness of the undoped insulator ranges from 10 nm to 50 nm, and more preferably 20-30 nm. The resulting second portion of trench memory structure 5 is shown in FIG. 5C.

In step 450, the insulator 600 and 590 are removed from the top of the poly 30 and the pad layer 535 to form a collar 80 on trench sidewall. The collar 80 comprises an undoped portion 100 and doped portion 90. A reactive ion etching (RIE) can be used to form the collar. The RIE etchback removes portions of the undoped insulator 600 so that the collar 80 is formed with a doped insulator lower portion 90 and an undoped insulator upper portion 100. The doped insulator has a height of 30-150 nm and the undoped insulator has a height of 500-1200 nm. Dopant in the doped portion of the collar is driven into the substrate by the subsequent thermal process to form a localized doped region 95. In one embodiment, the doped collar portion is doped with boron and thus the localized doped region 95 in the substrate is P-type. In another embodiment, the localized doped region in the substrate is self-aligned to the buried plate. The resulting third portion of trench memory structure 5 is shown in FIG. 5D.

In step 460, standard trench memory processing is used to form the remaining components of the trench memory 5 shown in FIG. 3. This may include filling the formed collar 80 with a conducting material 32, recessing the conducting material 32, removing the exposed collar, buried strap 110 formation by deposition and recess of strap material 34, and isolating active areas by STI formation, such as, for example, by anisotropic etching, filling with an oxide, planarizing to the surface of the substrate 20 and capping the deep trench capacitor 10. As needed by the trench capacitor 10, well implants, gate oxidation, gate conductors, and source-drain diffusions are formed. Other structural features, such as gate conductors and wiring, are common in the field of trench memory, and, as such, are omitted for brevity. Hence, the remainder of the deep trench capacitor is formed so as to produce a trench memory structure 5 such as that shown in FIG. 3, for example.

While the instant disclosure has been described with reference to one or more exemplary embodiments, it will be understood by those skilled in the art that various changes may be made and equivalents may be substituted for elements thereof without departing from the scope thereof. In addition, many modifications may be made to adapt a particular situation or material to the teachings of the disclosure without departing from the scope thereof. Therefore, it is intended that the disclosure not be limited to the particular embodiment(s) disclosed as the best mode contemplated for carrying out this invention, but that the invention will include all embodiments falling within the scope of the appended claims.

What is claimed is:

1. A trench memory cell comprising:
   a semiconductor substrate;
   a trench capacitor formed in the semiconductor substrate;
   a transistor electrically coupled to the trench capacitor; and
   a collar between the trench capacitor and the transistor, wherein the collar comprises an undoped portion and a doped portion.

2. The trench memory cell of claim 1, wherein the undoped portion of the collar is above the doped portion of the collar.

3. The trench memory cell of claim 1, wherein a length of the doped portion of the collar is less than a length of the undoped portion.

4. The trench memory cell of claim 1, wherein the doped portion of the collar comprises oxide doped with a P-type dopant.

5. The trench memory cell of claim 4, wherein the doped portion of the collar is an oxide doped with boron.

6. The trench memory cell of claim 1, further comprising a doped region in the substrate adjacent to the doped portion of the collar.

7. A deep trench capacitor comprising:
   a substrate;
   a trench in the substrate and having one or more walls;
   a buried plate of a first conductivity type in the substrate near a lower portion of the trench;
   a node dielectric layer on the one or more walls of the lower portion of the trench;
   a well region of a second conductivity type in the substrate above the buried plate;
   a strap of the first conductivity type adjacent to the trench;
   a conducting material fill disposed in the trench; and
   a collar insulator formed on the one or more walls of the trench above the buried plate, wherein the collar insulator comprises a doped portion and an undoped portion.

8. The deep trench capacitor of claim 7, further comprising a doped region in the substrate adjacent to the doped portion of the collar insulator.

9. The deep trench capacitor of claim 8, wherein the doped region is self-aligned to the buried plate.

10. The deep trench capacitor of claim 7, wherein the undoped portion of the collar is positioned above the doped portion of the collar insulator.

11. The deep trench capacitor of claim 7, wherein the undoped portion of the collar insulator and the doped portion of the collar insulator are selected from a group consisting essentially of oxide, nitride, oxynitride, high-k dielectrics, and any combination thereof.

12. The deep trench capacitor of claim 7, wherein the first conductivity type is N-type and the second conductivity type is P-type.

* * * * *